(12) United States Patent
Tsao et al.

(10) Patent No.: US 10,868,067 B2
(45) Date of Patent: Dec. 15, 2020

(54) IMAGE SENSOR DEVICE AND MANUFACTURING METHOD FOR IMPROVING SHUTTER EFFICIENCY

(71) Applicant: TAIWAN SEMICONDUCTOR MANUFACTURING COMPANY LTD., Hsinchu (TW)

(72) Inventors: Tsun-Kai Tsao, Tainan (TW); Shih-Pei Chou, Tainan (TW); Jiech-Fun Lu, Tainan County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/734,991

(22) Filed: Jan. 6, 2020

(65) Prior Publication Data

US 2020/0144319 A1 May 7, 2020

Related U.S. Application Data

(62) Division of application No. 15/882,468, filed on Jan. 29, 2018, now Pat. No. 10,529,761.

(60) Provisional application No. 62/550,876, filed on Aug. 28, 2017.

(51) Int. Cl.
*H01L 27/146* (2006.01)

(52) U.S. Cl.
CPC .. *H01L 27/14623* (2013.01); *H01L 27/14614* (2013.01); *H01L 27/14625* (2013.01); *H01L 27/14636* (2013.01); *H01L 27/14689* (2013.01)

(58) Field of Classification Search
CPC ......... H01L 27/14623; H01L 27/14636; H01L 27/14625; H01L 27/14614; H01L 27/14689
USPC ...... 438/60, 73, 76; 257/222, 230, 292, 294, 257/435, E27.13, E31.001, E31.097, 257/E31.122, E31.124; 348/294, 305, 348/308
See application file for complete search history.

(56) References Cited

U.S. PATENT DOCUMENTS

| | | | | |
|---|---|---|---|---|
| 7,791,118 B2* | 9/2010 | Kitano | ............... | H01L 27/14601 257/294 |
| 8,835,991 B2* | 9/2014 | Arakawa | ................. | H01L 31/18 257/230 |
| 9,508,766 B2* | 11/2016 | Noh | ................... | H01L 27/14614 |
| 2006/0170009 A1* | 8/2006 | Kitano | ............... | H01L 27/14601 257/236 |
| 2011/0031575 A1* | 2/2011 | Nakagawa | ........ | H01L 31/02165 257/432 |

(Continued)

*Primary Examiner* — Dao H Nguyen
(74) *Attorney, Agent, or Firm* — WPAT, P.C., Intellectual Property Attorneys; Anthony King

(57) ABSTRACT

A method of manufacturing a semiconductor device includes: providing a semiconductive substrate; forming a gate structure over the semiconductive substrate; forming a first dielectric layer over the gate structure; forming a first through hole in the first dielectric layer adjacent to and spaced apart from a sidewall of the gate structure; filling the first through hole with a material; forming a via in the first dielectric layer by etching the material and the first dielectric layer; removing the material to form a second through hole in the first dielectric layer; and forming a conductive structure by filling the via and the second through hole with a conductive material.

20 Claims, 14 Drawing Sheets

(56) References Cited

U.S. PATENT DOCUMENTS

2012/0112254 A1* 5/2012 Nagano ............. H01L 27/14818
 257/292
2016/0027828 A1* 1/2016 Lee ................... H01L 27/14616
 257/229

* cited by examiner

IMAGE SENSOR DEVICE AND MANUFACTURING METHOD FOR IMPROVING SHUTTER EFFICIENCY

PRIORITY CLAIM AND CROSS-REFERENCE

This application is a divisional application of U.S. patent application Ser. No. 15/882,468 filed 29 Jan. 2018, and claims priority to U.S. patent application Ser. No. 62/550,876 filed 28 Aug. 2017, all of which are hereby incorporated by reference in its entirety.

BACKGROUND

As technologies evolve, complementary metal-oxide semiconductor (CMOS) image sensors attract more and more attention due to their performance advantages. For example, CMOS image sensors can provide higher image acquisition rates, lower operating voltages, lower power consumption and greater noise immunity. A CMOS image sensor typically comprises an array of light-sensing elements or pixels. Each of the pixels is configured to convert received photons into electrons. Additionally, the CMOS image sensor comprises circuitry to transform the electrons into electrical signals. The electrical signals are then processed to generate an image of a subject scene.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

Figure 1:
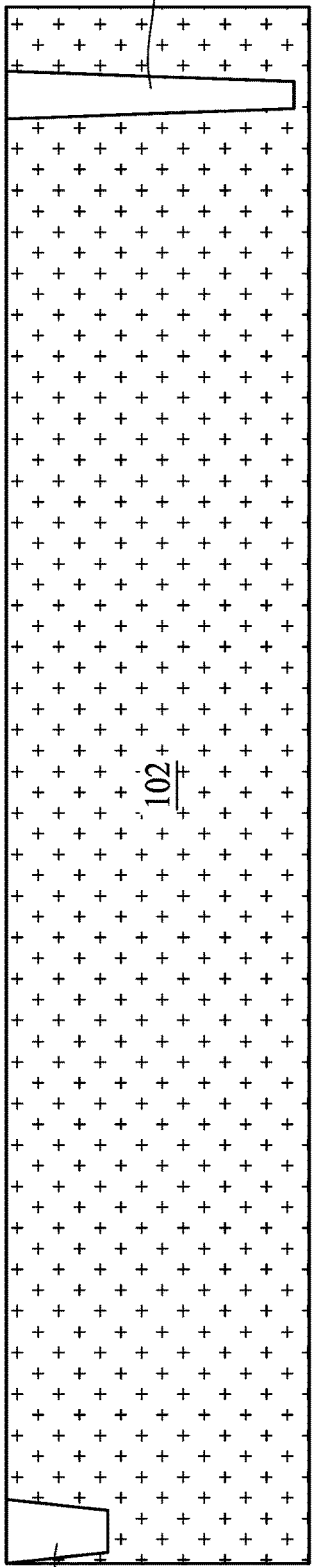
FIGS. 1 to 10 are cross-sectional views of intermediate stages of a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides structures and manufacturing operations of an image sensor device according to various embodiments. The performance of the image sensor is determined by several factors, such as the signal-to-noise ratio, sensitivity, and dynamic range. Additionally, shutter efficiency is regarded as an important factor in improving the image quality. The shutter efficiency, usually in connection to a global shutter scheme, refers to a measure of how well the charges can be stored in the storage gate without being contaminated, such as by stray light or stray current. The storage gate is used in the global shutter scheme for temporarily storing the photo-transformed electrons. Greater shutter efficiency allows the pixel to provide better image quality. Of several approaches to improving shutter efficiency taken recently by researchers, improved storage gate design shows particular promise and is discussed in the present disclosure. A metal shield may be utilized to protect the storage gate from parasitic light or stray electrons. Accordingly, pixel data represented by the electrons stored in the storage gate can provide greater accuracy. In the present disclosure, the manufacturing method and structure of the storage gate and metal shield are redesigned. The proposed metal shield structure can provide superior noise-blocking performance. As a result, the shutter efficiency can be effectively increased.

FIGS. 1 to 10 and FIGS. 11 to 13 are cross-sectional views of intermediate stages of a method of manufacturing a semiconductor device 100, in accordance with some embodiments. The semiconductor device 100 can be an image sensor, such as a front-side illumination (FSI) image sensor or a back-side illumination (BSI) image sensor. The semiconductor device 100 may include an array of image pixels arranged in rows and columns, of which one exemplary pixel is illustrated. Referring to FIG. 1, a semiconductive substrate 102 is received or provided. The semiconductive substrate 102 includes a semiconductive material such as silicon, germanium, silicon germanium, silicon carbide, gallium arsenide, or the like. Alternatively, the semiconductive substrate 102 includes a compound semiconductor having gallium arsenic, gallium phosphide, indium phosphide, indium arsenide, indium antimonide, or combinations thereof. In other alternatives, the semiconductive substrate 102 may include a doped epitaxial layer, a gradient semiconductive layer, or a semiconductive layer overlaying another semiconductive layer of a different type, such as a silicon layer on a silicon germanium layer. The semiconductive substrate 102 may be doped with an N-type dopant, such as arsenic, phosphor, or the like, or may be doped with a P-type dopant, such as boron or the like. In the depicted embodiment, the semiconductive substrate 102 includes bulk silicon doped with P-type dopants.

Next, isolation structures 104 and 106 are formed in the semiconductive substrate 102. The isolation structures 104 and 106 are used for isolating a pixel area from adjacent pixel areas or features. The isolation structures 104 and 106 may be trench-type isolation or local oxidation of silicon (LOCOS). The isolation structure 104 may refer to a shallow trench isolation (STI) and the isolation structure 106 may be a deep trench isolation (DTI) in which the DTI 106 has a depth greater than the depth of the STI 104. As an exemplary operation for manufacturing the isolation structure 104 or 106, several recesses are formed initially by an etching operation, such as a dry etching, a wet etching, a reactive ion etching (RIE) operation, or the like. Next, isolation materials are filled into the recesses to form the isolation structures 104 and 106. The isolation materials may be formed of electrically insulating materials, such as dielectric materials. In some embodiments, the isolation structures 104 and 106 are formed of oxide, nitride, oxynitride, silicon dioxide, nitrogen-bearing oxide, nitrogen-doped oxide, silicon oxynitride, polymer, or the like. The dielectric material may be formed using a suitable process such as chemical vapor deposition (CVD), physical vapor deposition (PVD), atomic layer deposition (ALD), thermal oxidation, UV-ozone oxidation, or combinations thereof. In some embodiments, a planarization operation, such as grinding or chemical mechanical planarization (CMP) processes, may be used to remove excess materials of the isolation structure 104 or 106 and level the top surfaces of the isolation structures 104 or 106 with the semiconductive substrate 102. In an embodiment, the isolation structures 104 and 106 are formed by a single etching and deposition operation, or they can be formed successively.

Figure 2:
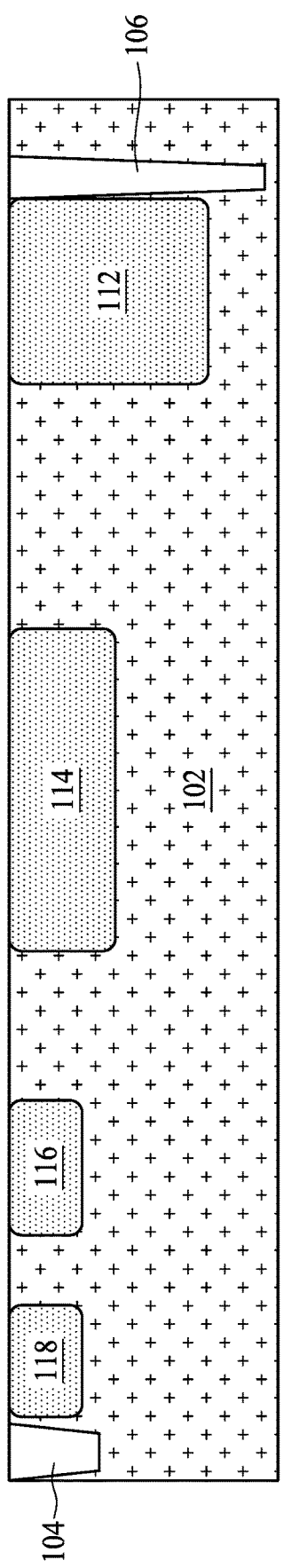

Referring to FIG. 2, a photo-sensitive region 112 is formed in the semiconductive substrate 102. The photo-sensitive region 112 receives or detects photons, light or radiation incident to the surface of the light sensitive region 112 and transforms the received photons into electrical current. In an embodiment, the photo-sensitive region 112 includes doped regions with N-type or P-type dopants. In some embodiments, the photo-sensitive region 112 may be formed of photo-sensing elements such as a pinned layer photodiode and a non-pinned layer photodiode. In an embodiment, the photo-sensitive region 112 is comprised of a layered structure. For example, the photo-sensitive region 112 may include stacked layers of alternating silicon layer and silicon germanium layer (not separately shown). The alternating silicon layer and the silicon germanium layer may be formed of a superlattice multiple quantum well structure. Alternatively, the silicon layer and the silicon germanium layer may be formed of a multiple quantum dot matrix.

As shown in FIG. 2, well regions 114, 116 and 118 are also formed in the semiconductive substrate 102. The well region 114 or 116 may include P-type or N-type dopants. The well region 116, which refers to a floating diffusion node, is formed as a charge tank to store charges generated by the photo-sensitive region 112. The charges stored in the well region 116 are read out in a readout operation. In the depicted embodiment, the floating diffusion node 116 has an N-type dopant. In some embodiments, the floating diffusion region 116 has a doping concentration greater than a doping concentration of the semiconductive substrate 102. The well region 114 serves as an intermediate charge tank between the photo-sensitive region 112 and the floating diffusion node 116 in a global shutter scheme and can be regarded an additional floating diffusion node. In the depicted embodiment, the floating diffusion region 114 has an N-type dopant. In some embodiments, the floating diffusion region 114 has a doping concentration greater than a doping concentration of the semiconductive substrate 102. The well region 118 serves as one source/drain region of a gate structure in a readout circuitry, details of which are provided in subsequent paragraphs. The well region 118 may include P-type or N-type dopants. In the depicted embodiment, the well region 118 has an N-type dopant. In some embodiments, the well region 118 has a doping concentration greater than a doping concentration of the semiconductive substrate 102. In an embodiment, the well regions 114, 116 and 118 may be formed by an ion implantation scheme to implant the dopants, followed by an annealing operation to activate the implanted dopants.

Figure 3:
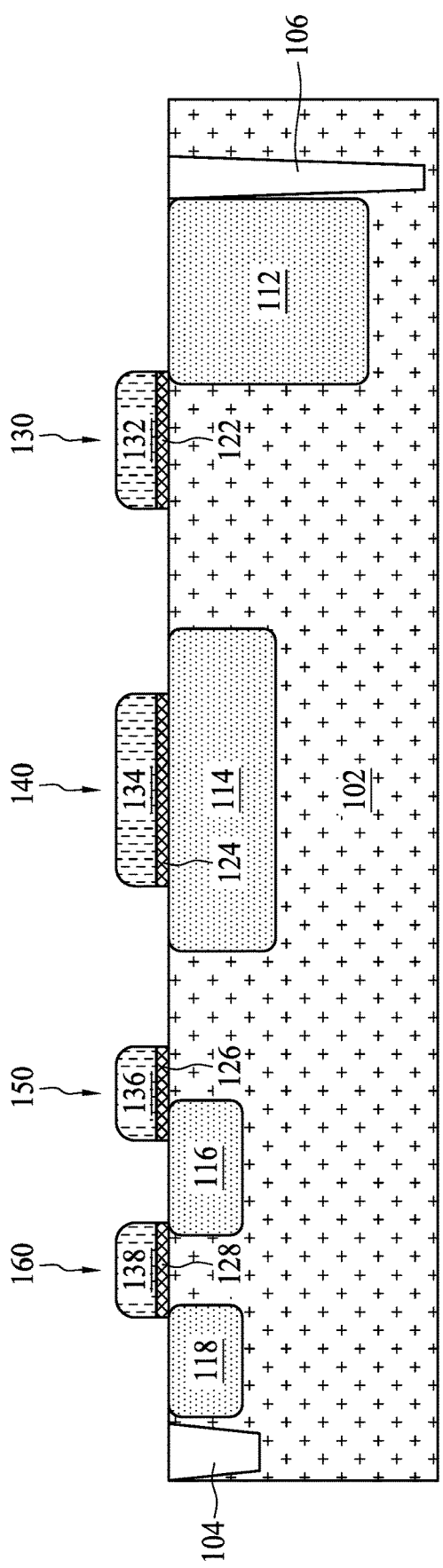

Subsequently, gate structures 130, 140, 150 and 160 are formed over the semiconductive substrate 102, as shown in FIG. 3. The gate structures 130, 140, 150 and 160 may include a dielectric material 122, 124, 126 and 128, respectively, and a gate electrode 132, 134, 136 and 138 over the respective dielectric material. In an embodiment, the dielectric material 122, 124, 126 or 128 is formed of nitride, oxide, oxynitride, or the like. In an embodiment, the dielectric material 122, 124, 126 or 128 includes a high-k material, such as $HfO_2$, $ZrO_2$, $La_2O_3$, $Y_2O_3$, $Al_2O_3$, $TiO_2$, $HfSi_xO_y$, $ZrSi_xO_y$, $LaSi_xO_y$, $YSi_xO_y$, $AlSi_xO_y$, $TiSi_xO_y$, or the like. The dielectric materials 122, 124, 126 and 128 may include a same material. In an embodiment, the gate electrode 132, 134, 136 or 138 includes a conductive material or doped polysilicon. The conductive material may be selected from copper, tungsten, aluminum, and other suitable metals. The gate electrodes 132, 134, 136 and 138 may include a same material. In an embodiment, the gate structures 130, 140, 150 and 160 are formed by a same series of operations. As an exemplary operation, a blanket dielectric material may be deposited covering the semiconductive substrate 102. Next, a blanket gate material is formed over the blanket dielectric material. The deposition operation may be performed using CVD, PVD, ALD or the like. The dielectric material and the gate material are patterned to form the gate structures 130, 140, 150 and 160 and expose a portion of the semiconductive substrate 102.

The gate structure 130 is formed between the photo-sensitive region 112 and the well region 114. In an embodiment, the gate structure 130 is used as a first transfer gate. Charges transferred from the photo-sensitive region 112 to the well region 114 are conducted through a proper biasing on the gate electrode 132. The gate structure 140 is disposed adjacent to the gate structure 130. The gate structure 140 is formed directly above the well region 114. In an embodiment, the gate structure 140 is used as a storage gate. Charges transferred to the well region 114 are carried into the storage gate 140 in a data sensing operation for a pixel. Under the global shutter scheme, the pixel data for a certain row of pixels are stored in the respective storage gates. In an embodiment, the gate electrode 134 is a floating gate in which the charges move into or leave the gate electrode 134 of the storage gate 140 though the quantum tunneling effect. In an embodiment, the gate electrode 134 of the gate structure 140 has a width less than the width of the well region 114 and is covered by the well region 114.

The gate structure 150 is disposed between the storage gate 140 and the gate structure 160. The gate structure 150 is disposed between the well region 114 and the floating diffusion node (region) 116. In an embodiment, the gate structure 150 serves as a second transfer gate and is configured to enable transferring of the charges from the gate electrode 134 to the floating diffusion node 116 through appropriate biasing on the gate electrode 136. After the data sensing is completed, the charges in each pixel are read out from the respective floating diffusion node 116. The gate structure 160 may be part of a readout circuitry, such as a reset gate. The source/drain region 118 is used to receive charges in conjunction with the gate electrode 138 during data readout. Charges stored in the floating diffusion node 116 may move to a sensing circuit through the channel under the gate electrode 138 and the source/drain region 118 during the data readout operation.

Figure 4:
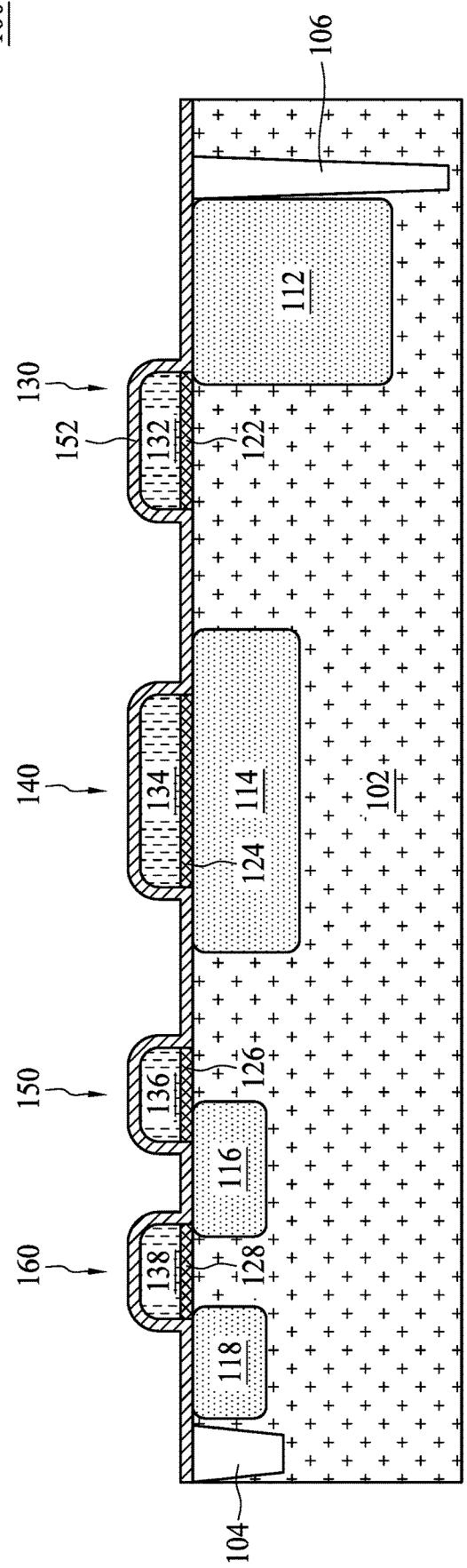

Referring to FIG. 4, a dielectric film 152 is deposited over the semiconductive substrate 102. The dielectric film 152 conformally covers the gate structures 130, 140, 150, and 160. In an embodiment, the dielectric film 152 serves as an etch stop layer. The dielectric film 152 may be formed of silicon oxide, silicon nitride, silicon oxynitride, or the like. In some embodiments, the dielectric film 152 may be formed of $HfO_2$, $ZrO_2$, $La_2O_3$, $Y_2O_3$, $Al_2O_3$, $TiO_2$, $HfSi_xO_y$, $ZrSi_xO_y$, $LaSi_xO_y$, $YSi_xO_y$, $AlSi_xO_y$, $TiSi_xO_y$, or the like. The dielectric film 152 may be formed by suitable methods, such as thermal oxidation, CVD, plasma-enhanced CVD (PECVD), PVD, or the like.

Figure 5:
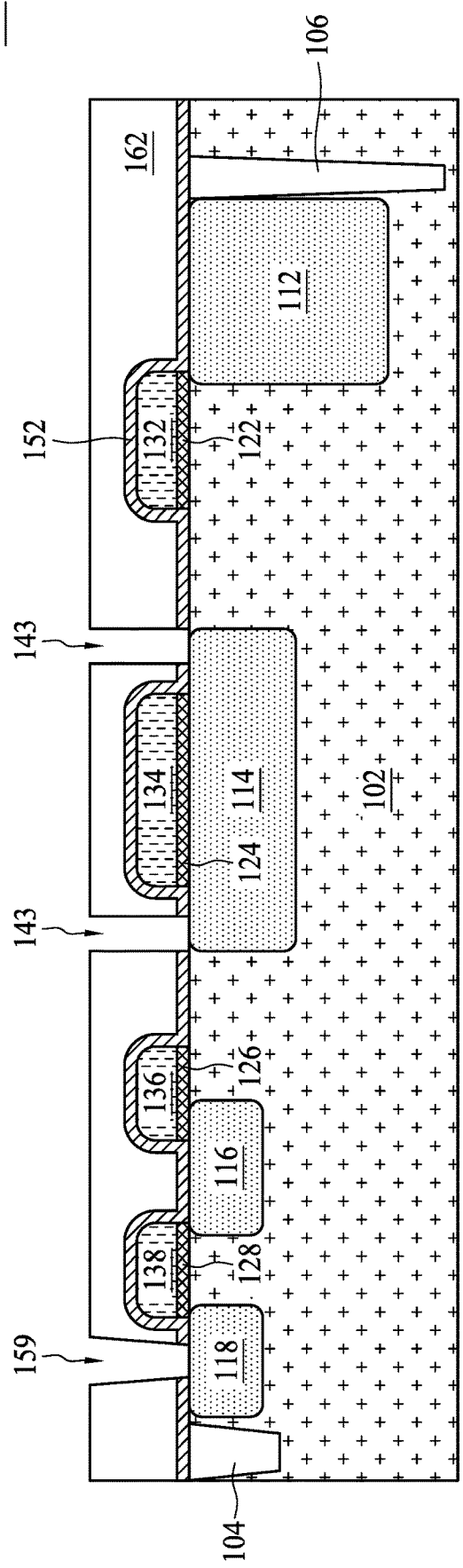

FIG. 5 shows the formation of a dielectric layer 162 over the semiconductive substrate 102. The dielectric layer 162 may be referred to as an interlayer dielectric (ILD). In an embodiment, the dielectric layer 162 covers the gate structures 130, 140, 150 and 160, and the dielectric film 152. The dielectric layer 162 may include silicon oxide, silicon nitride, silicon oxynitride, or the like. The dielectric layer 162 may be formed by a suitable deposition method, such as spin-on coating, CVD, PVD or the like. Subsequently, an patterning/etching operation is performed to form a trench or through hole 143 adjacent to the gate structure 140. In an embodiment, the through hole 143 is patterned to laterally surround the gate structure 140 (e.g., as will be later depicted in FIG. 10A). The through hole 143 may extend through the dielectric layer 162 and the dielectric film 152. Thus, the through hole 143 contacts an upper surface of the semiconductive substrate 102. In an embodiment, a portion of the well region 114 is exposed through the through hole 143. Alternatively, the dielectric film 152 and the dielectric layer 162 are formed of different materials (e.g., the film 152 and the layer 162 are formed of nitride and oxide, respectively), and the formation of the through hole 143 may be performed by etching through the dielectric layer 162 with the dielectric film 152 acting as an etch stop layer. The etch of the through hole 143 may thus stop at an upper surface of the dielectric film 152. Further, the through hole 143 is defined by an inner sidewall facing the gate structure 140 and an outer sidewall substantially parallel to the inner sidewall. In some embodiments, the inner sidewall of the through hole 143 is substantially parallel to the sidewall of the gate structure 140. In an embodiment, when viewed from above, the through hole 143 has a ring shape circumscribing the gate structure 140. The through hole 143 is to be filled with conductive materials and formed as part of a conductive structure 148, i.e., the peripheral portion 144 in FIG. 10 (the top view of the peripheral portion 144 has a ring shape as shown in FIG. 10A).

In addition, the dielectric layer 162 is etched to form a through hole or via 159 over the source/drain region 118. A portion of the source/drain region 118 is exposed accordingly. Through holes 143 and 159 may be formed concurrently by an etching operation, such as a dry etch, a wet etch, a reactive ionic etch (RIE), or combinations thereof.

Figure 6:
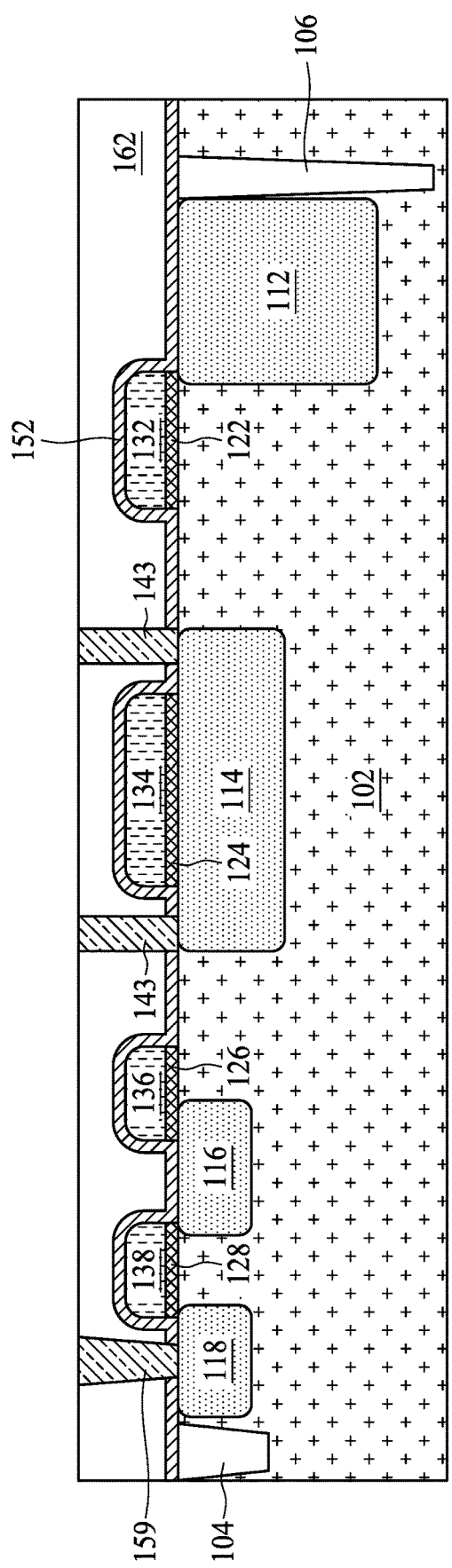

In FIG. 6, the through holes 143 and 159 are filled with an organic material. In an embodiment, the organic material is selected from a photoresist material, such as a positive photoresist or a negative photoresist. In an embodiment, the organic material is a polymeric material. The filling of the organic material in the through holes 143 and 159 may be performed using CVD, PVD, spin-on coating, or the like. In an embodiment, a planarization operation, such as grinding or CMP, may be utilized to level the filled through holes 143 and 159 and remove the excess organic materials over the semiconductive substrate 102.

Figure 7:
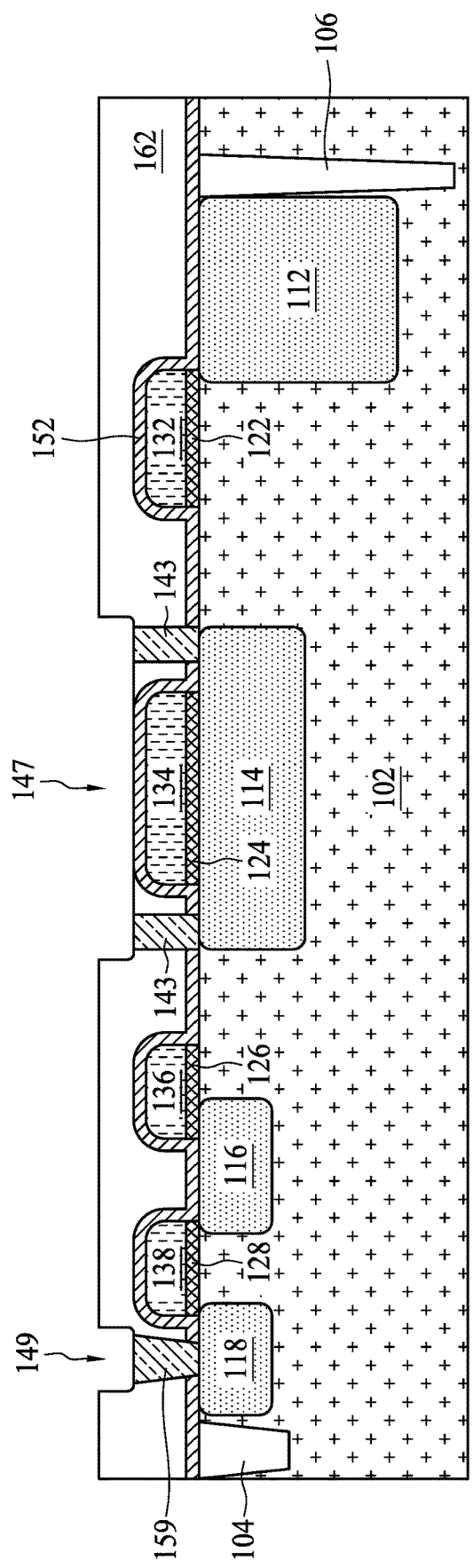

Next, the dielectric layer 162 is etched, as illustrated in FIG. 7. Portions of the dielectric layer 162 over the gate structure 140 and over the well region 118 are recessed. A recess 147 is formed and stops at the dielectric film 152 over the gate electrode 134. As such, a portion of the dielectric film 152 over the gate electrode 134 is exposed. In an embodiment, the recess 147 has a circular shape or a polygonal shape, such as a rectangle, from a top view perspective. The recess 147 may possess a shape following the pattern of the gate electrode 134 while having a greater area for completely covering the gate electrode 134. In an embodiment, the recess 147 has sidewalls extending beyond the outer sidewalls of the through hole 143 and thus completely covers the through hole 143. Moreover, a portion of the dielectric layer 162 remains between the through hole 143 and the gate electrode 134 during the etch of the recess 147. The remaining dielectric layer 162 below the recess 147 has a top surface leveled with the upper surface of the filled through hole 143. In an embodiment, a recess 149 is formed over the through hole 159. In an embodiment, the recess 149 has a size greater than the size of the through hole 159 from a top view perspective. The recess 147 or 149 may be formed by a wet etch, a dry etch, or an RIE operation. The recess 149 may be formed during a same etching operation for the recess 147, or the recesses 147 and 149 can be formed successively.

Figure 8:
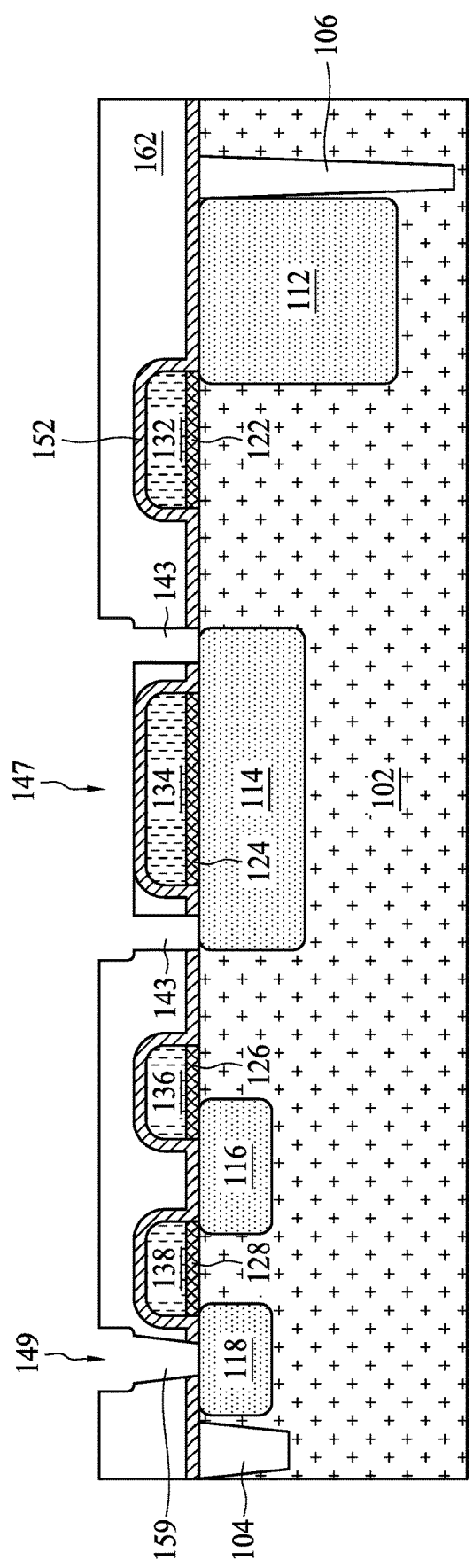

Referring to FIG. 8, the organic materials in the through holes 143 and 159 are removed. A bottom surface of the through hole 143 and a bottom surface of the trench 159 are exposed accordingly. The removal of the organic material can be performed using a wet etch, a dry etch or an RIE operation. In the depicted embodiment, a solvent is utilized to dissolve and remove the organic material. A post-cleaning operation may be performed to ensure complete removal of the residual organic material.

Figure 9:
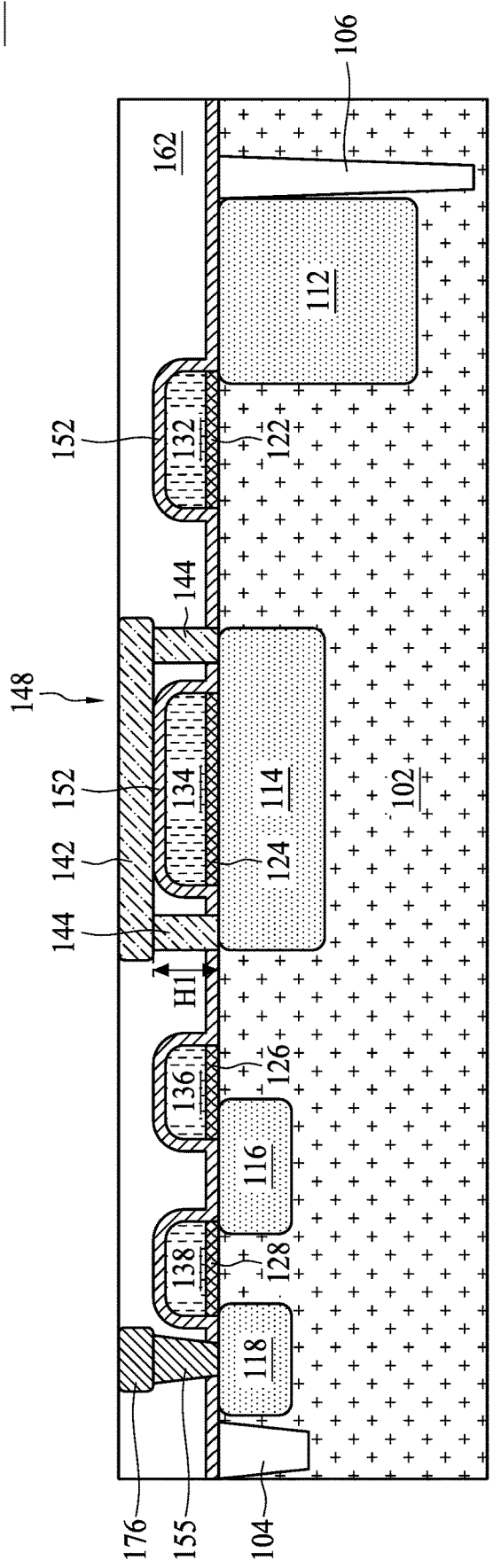

After the through holes 143 and 159 are emptied, a conductive structure 148 is formed in the recess 147 and the through hole 143, as demonstrated in FIG. 9. The conductive structure 148 may be formed by a conductive material such as titanium, tantalum, titanium nitride, tantalum nitride, copper, copper alloys, nickel, tin, gold, or combinations thereof. The conductive structure 148 includes a top portion 142 and a peripheral portion 144 occupying the spaces of the recess 147 and the through hole 143, respectively. In an embodiment, the top portion 142 is connected with the peripheral portion 144 from a lower surface of the top portion 142. In an embodiment, the top portion 142 of the conductive structure 148 covers the gate structure 140. In an embodiment, the peripheral portion 144 circumscribes the sidewall of the gate structure 140. In an embodiment, the peripheral portion 144 has a height H1, measured from the surface of the semiconductive substrate 102 to a lower surface of the top portion 142, substantially equal to a height of the gate structure 140. In an embodiment, the peripheral portion 144 is disposed proximal to and substantially parallel to the sidewall of the gate structure 140. In an embodiment, the top portion 142 contacts the dielectric film 152 around a top surface of the gate electrode 134. In an embodiment, the top portion 142 covers a top surface of the gate electrode 134. In an embodiment, the dielectric film 152 laterally surrounds the peripheral portion 144 of the conductive structure 148 adjacent to the semiconductive substrate 102. The configuration of the proposed conductive structure 148 can provide better protection of the storage gate 140 from external noise, such as undesired light or electric current. The accuracy of the pixel data represented by the charges contained in the storage gate 140 can be better maintained. Moreover, a conductor including a conductive via 155 and a conductive pad 176 over the conductive via 155 is formed in the recess 159 and the through hole 149. In an embodiment, the conductive via 155 and the conductive pad 176 have a conductive material similar to that of the conductive structure 148. In an embodiment, the conductive pad 176 has an area greater than the area of the conductive via 155 from a top view perspective. In an embodiment, the conductive pad 176 at least partially overlaps the conductive via 155. The conductive structure 148, the conductive via 155 and the conductive pad 176 may be formed by any suitable methods, such as CVD, PVD, ALD, sputtering, or the like.

The through hole 143 or the peripheral portion 144 adjacent to the gate electrode 134 is spaced apart from the sidewall of the gate electrode 134. In an embodiment, the dielectric material 162 fills spaces between the peripheral portion 144 and the gate electrode 134. The geometry of the width of the through hole 143 is determined as a process-friendly dimension such that a desirable etching operation for forming the through hole 143 and a subsequent filling operation for forming the peripheral portion 144 can be realized successfully. For one thing, existing schemes completely remove the dielectric material 162 over and on sidewalls of the gate electrode 134 to create spaces for the conductive structure 148. However, such a removal operation is usually unsuccessful due to the narrowed width of the spaces toward the bottom of the gate electrode 134. The narrowed width may not be process friendly, where residues of the dielectric layer 162 may remain near the bottom of the gate electrode 134 after the etching operation due to loading effect. As a result, the remaining residual dielectric material 162 may deteriorate the filling performance of conductive materials in the spaces (e.g., generate voids/opening around the gate electrode). Embodiments in accordance with the instant disclosure may provide a well-managed formation operation at the peripheral portion 144 to form a reliable conductive structure (e.g., structure 148) around the gate electrode 134 without void or opening.

Figure 10:
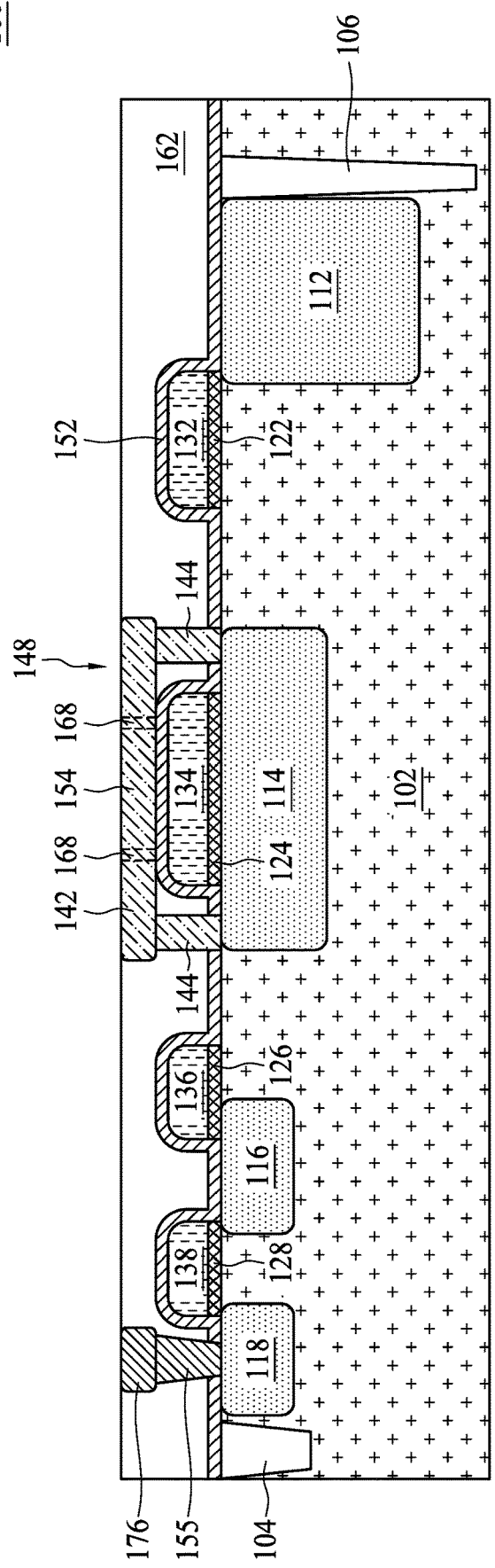
Figure 10A:
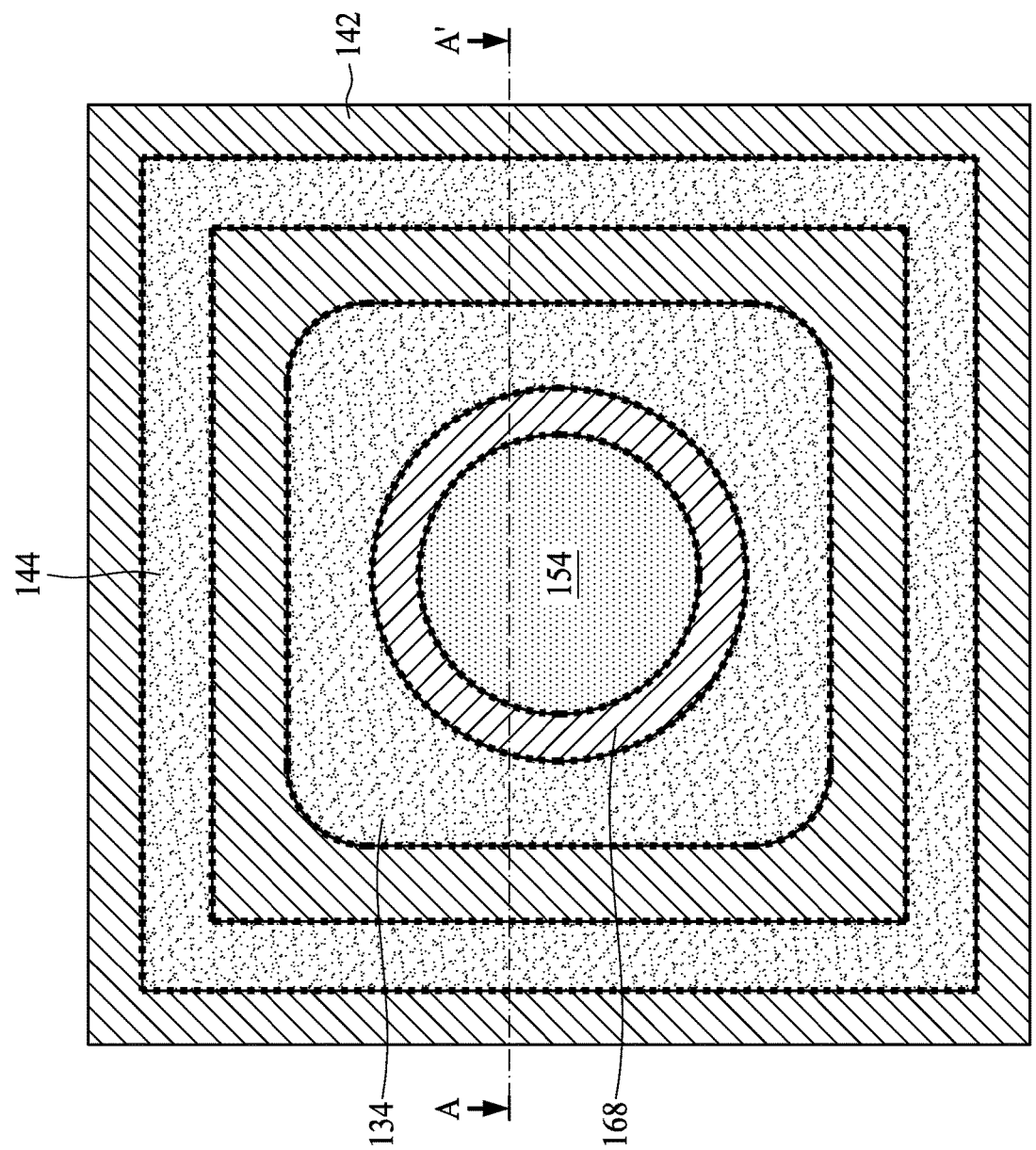
FIG. 10A is a schematic top view of a gate structure of the semiconductor device shown in FIG. 10, in accordance with some embodiments.

Referring to FIGS. 10 and 10A, a conductive plug 154 is formed in the top portion 142. An insulating material 168 may be formed such that the conductive plug 154 is electrically insulated from the remaining portion of the top portion 142 by the insulating material 168. In operation, the conductive plug 154 receives a biasing voltage and is configured to attract charges in the well region 114 toward the gate electrode 134 of the storage gate 140 during an image sensing operation. In an embodiment, the insulating material includes dielectric materials such as silicon nitride, silicon oxide, silicon oxynitride, or the like. In an embodiment, the dielectric materials include a high-k material, such as $HfO_2$, $ZrO_2$, $La_2O_3$, $Y_2O_3$, $Al_2O_3$, $TiO_2$, $HfSi_xO_y$, $ZrSi_xO_y$, $LaSi_xO_y$, $YSi_xO_y$, $AlSi_xO_y$, $TiSi_xO_y$, or the like. The insulating material 168 may be formed by initially etching the top portion 142. The etching operation forms an enclosing trench pattern that runs through the thickness of the top portion 142 and reaches the dielectric material 152. FIG. 10A shows a top view of the gate structure 140 in which the cross-sectional view of FIG. 10 is drawn from the sectional line A-A' of FIG. 10A. In the depicted example, the top portion 142 of the conductive structure 148 covers the top surface of the gate electrode 134 of the gate structure 140 from a top view perspective. In an embodiment, the insulating material 168 has a ring shape from a top view perspective and consists of concentric circles overlapping the gate electrode 134. Next, the insulating material 168 is deposited into the etched trench of the top portion 142 to form a ring electrically insulating the top portion 142 and the conductive plug 154.

Figure 11:
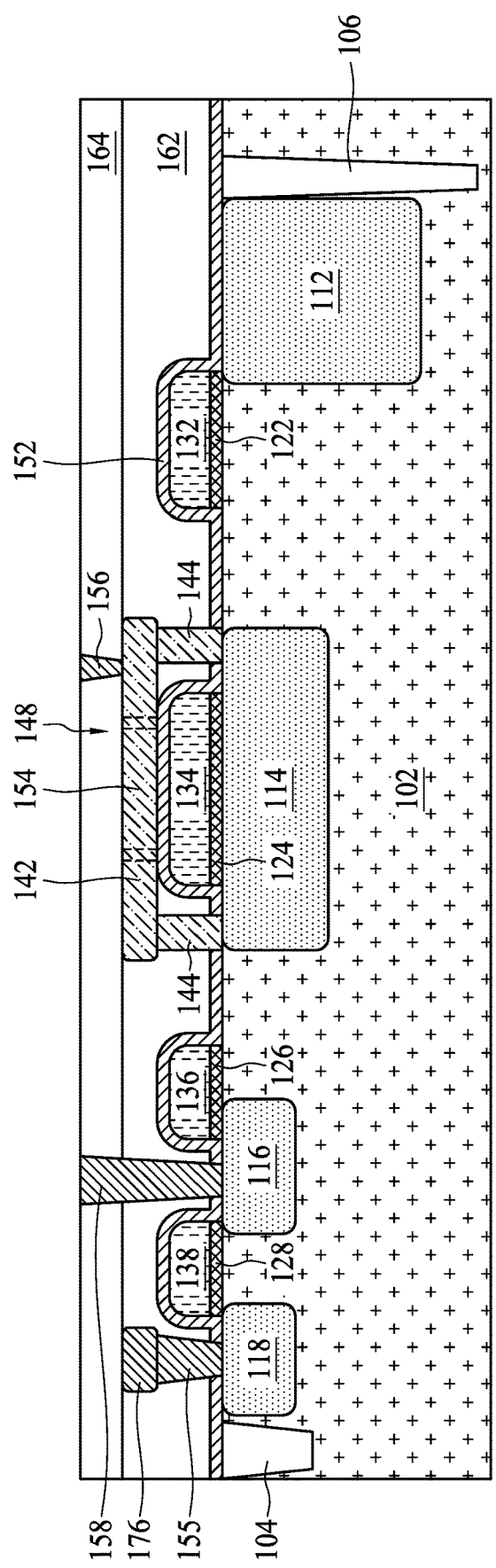
FIGS. 11 to 13 are cross-sectional views of additional intermediate stages of a method of manufacturing a semiconductor device, in accordance with some embodiments.

FIG. 11 shows the formation of another dielectric layer 164 over the dielectric layer 162. The dielectric layer 164 may be referred to as an additional interlayer dielectric (ILD). The dielectric layer 164 may include silicon oxide, silicon nitride, silicon oxynitride, or the like. The dielectric layer 164 may be formed by a suitable deposition method, such as spin-on coating, CVD, PVD or the like. Subsequently, conductive vias 156 and 158 are formed in the dielectric layer 164. As an exemplary operation, the dielectric layer 164 is recessed and the trenches are formed over the gate structure 140 and the well region 116. The trench facing the well region 116 may further run through the dielectric layer 162 and reach the well region 116. Subsequently, a conductive material is deposited in the trenches to construct the conductive vias 156 and 158 in place. In an embodiment, the conductive vias 156 and 158 may be formed of a conductive material such as titanium, tantalum, titanium nitride, tantalum nitride, copper, copper alloys, nickel, tin, gold, or combinations thereof, through a deposition approach such as CVD, PVD, ALD, or the like.

Figure 12:
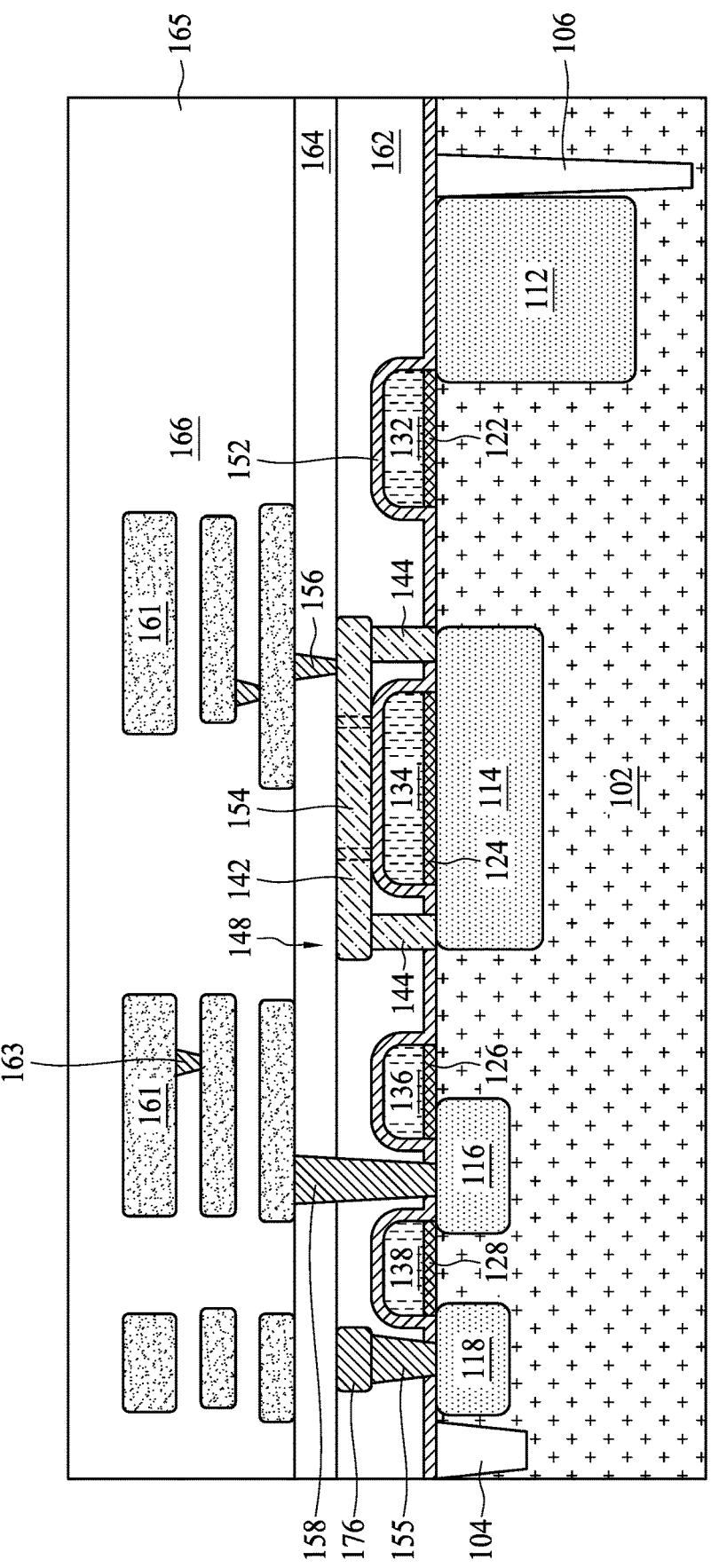

Next, an interconnect layer 165 is formed over the dielectric layer 164 as shown in FIG. 12. The interconnect layer 165 is configured to electrically couple the components in the semiconductive substrate 102 and the dielectric layers 162 and 164 with external devices. In some cases, the interconnect layer 165 may establish redistributed connections for the features in the semiconductive substrate 102 and dielectric layers 162 and 164 for facilitating signal transmission. Thus, the interconnect layer 165 can also be termed a redistribution layer (RDL). The interconnect layer 165 may include layered conductive lines 161. The conductive lines 161 in each layer extend along a horizontal direction and are interconnected through adjacent vertical conductive vias or contacts 163. The conductive lines 161 and conductive vias/contacts 163 may be formed of conductive materials, such as copper, tungsten, aluminum, silver, combinations thereof, or the like. The number of layers for conductive lines 161 or conductive vias/contacts 163 can be configured in adaptation to different applications as desired. Furthermore, although not separately shown, one or more metal lines and metal vias in the interconnect layer 165 or the dielectric layers 162 and 164 (e.g., conductive via 156) are established and are electrically coupled to the conductive plug 154, thereby supplying a biasing voltage to the conductive plug 154.

Figure 13:
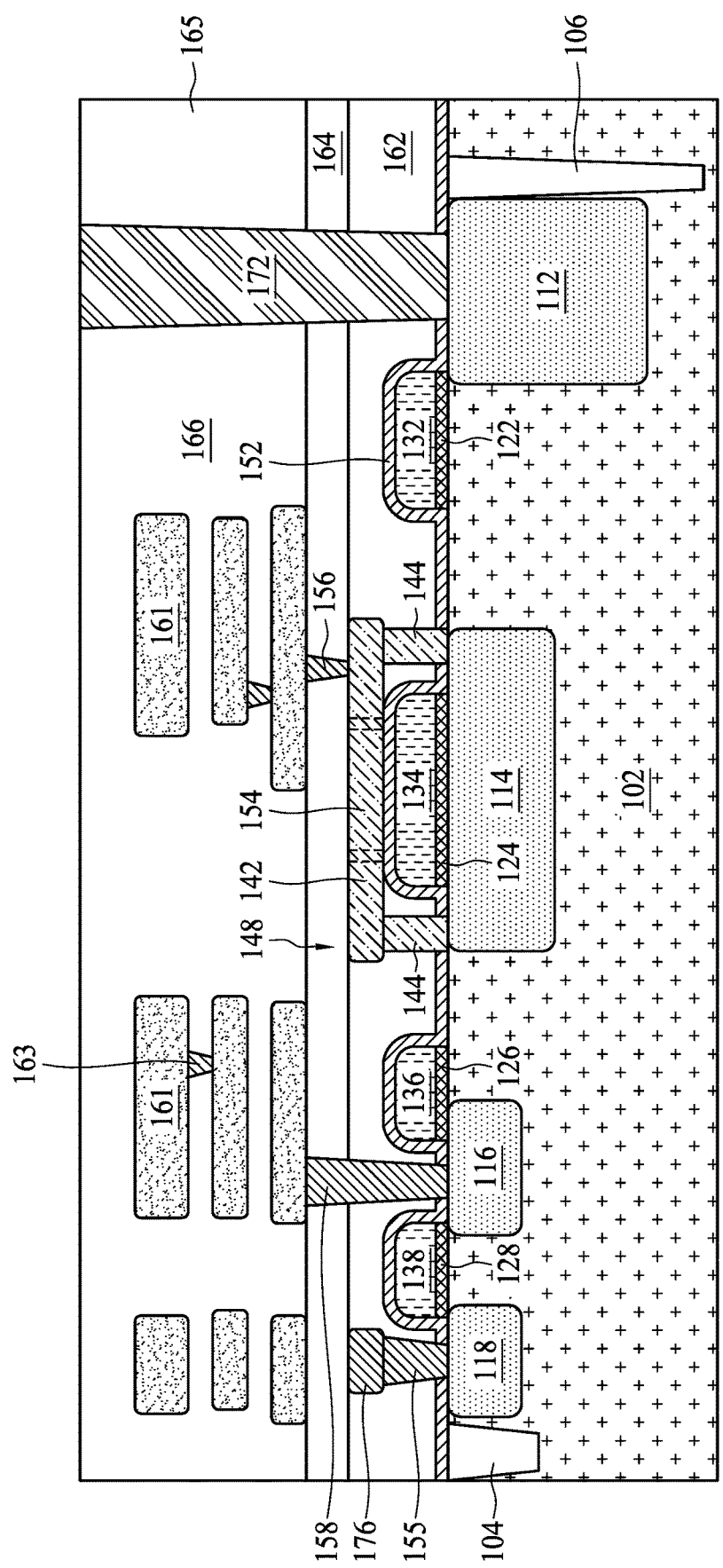

Referring to FIG. 13, a light pipe 172 is formed in the interconnect layer 165 and the dielectric layers 162 and 164. The light pipe 172 is configured to receive light and direct the received light through the interconnect layer 165 and the dielectric layers 162 and 164 towards the photo-sensitive region 112. The light pipe 172 may include resin, spin-on glass, or other suitable transparent or translucent material. The light pipe 172 may be formed by recessing the interconnect layer 165 through the dielectric layers 162 and 164, followed by deposition of the light pipe material 172. A planarization operation, such as grinding or CMP, may be utilized to level the upper surface of the light pipe 172 with the interconnect layer 165.

According to an embodiment of the present disclosure, a method of manufacturing a semiconductor device includes: providing a semiconductive substrate; forming a gate structure over the semiconductive substrate; forming a first dielectric layer over the gate structure; forming a first through hole in the first dielectric layer adjacent to and spaced apart from a sidewall of the gate structure; filling the first through hole with a material; forming a via in the first dielectric layer by etching the material and the first dielectric layer; removing the material to form a second through hole in the first dielectric layer; and forming a conductive structure by filling the via and the second through hole with a conductive material.

According to an embodiment of the present disclosure, a method includes: providing a substrate; forming a gate structure over the substrate; depositing a dielectric film over the gate structure; forming a dielectric layer over the dielectric film; etching a via in the dielectric layer to expose a an upper surface of the dielectric film and keeping a sidewall of the dielectric layer covered by the dielectric layer; and forming a conductive structure by filling the via with a conductive material.

According to an embodiment of the present disclosure, a method includes: providing a substrate; forming a photo-sensitive region in the substrate; forming a gate structure over the substrate; forming a dielectric layer over the gate structure and the photo-sensitive region; forming a via extending through the dielectric layer, the via including a ring shape laterally surrounding the gate structure; and forming a second trench over the gate structure by removing an upper portion of the dielectric layer and an upper portion of the via, wherein the second trench includes a top portion having a substantially equal thickness across the gate structure. The method also includes forming a metal shield in the via and the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a semiconductive substrate;
   forming a gate structure over the semiconductive substrate;
   forming a first dielectric layer over the gate structure;
   forming a first through hole in the first dielectric layer adjacent to and spaced apart from a sidewall of the gate structure;
   filling the first through hole with a material;
   forming a via in the first dielectric layer by etching the material and the first dielectric layer;
   removing the material to form a second through hole in the first dielectric layer; and
   forming a conductive structure by filling the via and the second through hole with a conductive material.

2. The method according to claim 1, wherein the conductive structure comprises a top portion covering a top surface of the gate structure from a top view perspective.

3. The method according to claim 2, wherein the conductive structure comprises a peripheral portion between the top portion and the semiconductive substrate, the peripheral portion surrounding and spaced apart from the sidewall of the gate structure.

4. The method according to claim 1, wherein forming a first through hole comprises causing the first through hole to expose a portion of the semiconductive substrate.

5. The method according to claim 1, further comprising forming a dielectric film conformally covering the gate structure prior to forming the first dielectric layer.

6. The method according to claim 5, wherein forming a first through hole comprises causing the first through hole to extend through the dielectric film.

7. The method according to claim 5, further comprising forming a conductive plug extending through the conductive structure and terminating on the dielectric film.

8. The method according to claim 7, further comprising forming a insulating material electrically isolating the conductive plug from the conductive structure.

9. The method according to claim 5, wherein removing the material to form a second through hole comprises exposing a top surface of the dielectric film.

10. The method according to claim 5, further comprising forming a second dielectric layer over the semiconductive substrate prior to forming the gate structure, wherein the dielectric film laterally surrounds the second dielectric layer.

11. The method according to claim 5, wherein forming a first through hole in the first dielectric layer comprises causing the first through hole to extend through the dielectric film.

12. The method according to claim 1, wherein forming a via in the first dielectric layer comprises causing a bottom surface of the via to extend beyond an outer sidewall of the first through hole.

13. A method, comprising:
   providing a substrate;
   forming a gate structure over the substrate;
   depositing a dielectric film over the gate structure;
   forming a dielectric layer over the dielectric film;
   etching a via in the dielectric layer to expose an upper surface of the dielectric film and keeping a sidewall of the dielectric film covered by the dielectric layer; and
   forming a conductive structure by filling the via with a conductive material.

14. The method according to claim 13, wherein the conductive structure comprises a peripheral portion having a substantially equal width and laterally surrounding the dielectric film.

15. The method according to claim 13, further comprising forming a well region in the substrate and aligned with the gate structure.

16. The method according to claim 15, wherein the conductive structure is in contact with the well region.

17. A method, comprising:
   providing a substrate;
   forming a photo-sensitive region in the substrate;
   forming a gate structure over the substrate;
   forming a dielectric layer over the gate structure and the photo-sensitive region;
   forming a via extending through the dielectric layer, the via comprising a ring shape laterally surrounding the gate structure;
   forming a second trench over the gate structure by removing an upper portion of the dielectric layer and an upper portion of the via, the second trench comprising a top portion having a substantially equal thickness across the gate structure; and
   forming a metal shield in the via and the second trench.

18. The method according to claim 17, wherein the via comprises an organic material, wherein forming a metal shield in the via comprises removing the organic material and depositing a conductive material in the via.

19. The method according to claim 17, wherein forming a via comprises preventing a lower portion of the dielectric layer between the gate structure and the via from being etched.

20. The method according to claim 19, wherein the lower portion comprises an upper region adjacent to a top portion of the metal shield and a lower region adjacent to the substrate, and the upper region comprises a width greater than a width of the lower region.

* * * * *